US006985840B1

(12) United States Patent
Hsu et al.

(10) Patent No.: US 6,985,840 B1
(45) Date of Patent: Jan. 10, 2006

(54) CIRCUIT PROPERTY VERIFICATION SYSTEM

(75) Inventors: Yu-Chin Hsu, Cupertino, CA (US); Furshing Tsai, San Jose, CA (US); Tayung Liu, Sunnyvale, CA (US)

(73) Assignee: Novas Software, Inc., San Jose, CA (US)

( * ) Notice: Subject to any disclaimer, the term of this patent is extended or adjusted under 35 U.S.C. 154(b) by 488 days.

(21) Appl. No.: 09/630,348

(22) Filed: Jul. 31, 2000

(51) Int. Cl.
 *G06F 7/48* (2006.01)
(52) U.S. Cl. .............................. 703/7; 703/14; 703/15; 703/17; 716/5
(58) Field of Classification Search ................. 703/14, 703/15, 7, 17; 716/4, 5; 713/400; 714/37, 714/744, 741; 710/72
See application file for complete search history.

(56) References Cited

U.S. PATENT DOCUMENTS

| | | | | |
|---|---|---|---|---|
| 5,263,149 A | * | 11/1993 | Winlow ........................ | 703/15 |
| 5,465,216 A | * | 11/1995 | Rotem et al. .................. | 716/5 |
| 5,513,122 A | | 4/1996 | Cheng et al. .................. | 716/5 |
| 5,745,501 A | * | 4/1998 | Garner et al. ................. | 714/741 |
| 5,859,962 A | | 1/1999 | Tipon et al. ................... | 714/33 |
| 5,901,073 A | | 5/1999 | Kurshan et al. ............... | 703/6 |
| 5,905,883 A | | 5/1999 | Kasuya ......................... | 703/17 |
| 5,913,022 A | | 6/1999 | Tinaztepe et al. ............. | 714/25 |
| 5,937,183 A | | 8/1999 | Ashar et al. ................... | 703/14 |
| 5,966,516 A | | 10/1999 | De Palma et al. ............. | 703/1 |
| 5,974,575 A | | 10/1999 | Fujimoto ....................... | 714/700 |
| 6,009,531 A | * | 12/1999 | Selvidge et al. ............... | 713/400 |
| 6,115,763 A | * | 9/2000 | Douskey et al. .............. | 710/72 |
| 6,138,266 A | * | 10/2000 | Ganesan et al. ............... | 716/5 |
| 6,311,293 B1 | * | 10/2001 | Kurshan et al. ............... | 714/37 |
| 6,321,186 B1 | * | 11/2001 | Yuan et al. .................... | 703/15 |
| 6,339,837 B1 | * | 1/2002 | Li .................................. | 716/5 |
| 6,449,752 B1 | * | 9/2002 | Baumgartner et al. ......... | 716/5 |
| 6,484,134 B1 | * | 11/2002 | Hoskote ........................ | 703/14 |
| 6,496,953 B1 | * | 12/2002 | Helland ........................ | 714/744 |

OTHER PUBLICATIONS

Rabiei det al., "Model order reduction of large circuits using balanced truncation", IEEE 1999.*
Schlipf et al., "An easy approach to formal verification", IEEE 1997.*

\* cited by examiner

*Primary Examiner*—Leo Picard
*Assistant Examiner*—Kandasamy Thangavelu
(74) *Attorney, Agent, or Firm*—Daniel J. Bedell; Smith-Hill and Bedell

(57) ABSTRACT

Described herein is a system for verifying that a circuit described by a hardware description language file has a property of responding to an antecedent event represented by a particular pattern in its input signals by exhibiting a consequent behavior of producing a particular pattern in its output signals during a finite time following the antecedent event. The system includes a conventional circuit simulator for simulating the behavior of the circuit under conditions defined by a user-provided test bench. The simulator produces output waveform data representing the behavior of the circuit input, output and internal signals, including signals representing the circuit's state. When the output waveform data indicates the antecedent event has occurred, the system determines the current state of the circuit from the waveform data. The system then creates and analyzes a temporally expanded model of the circuit to verify whether, starting from that current state, the circuit will exhibit the consequent behavior within that finite time under all input signal conditions.

18 Claims, 5 Drawing Sheets

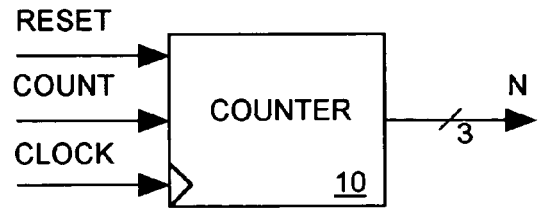
FIG. 1
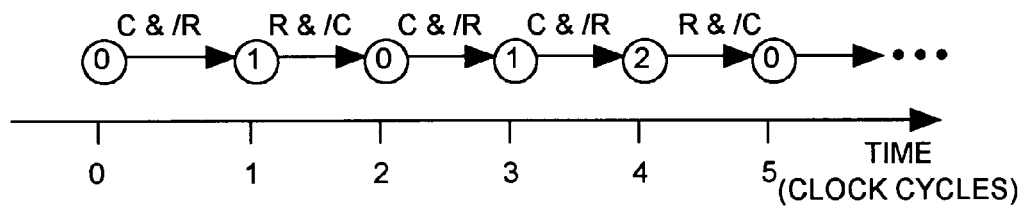
FIG. 2
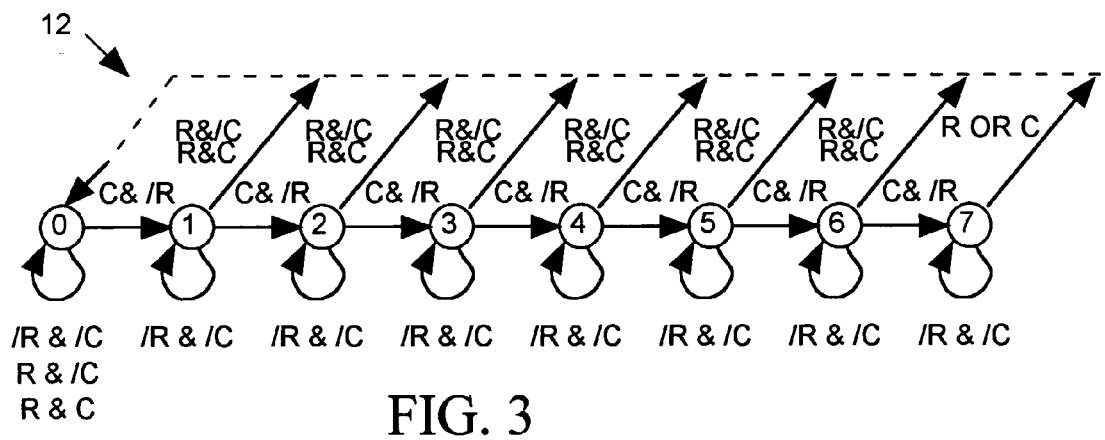
FIG. 3
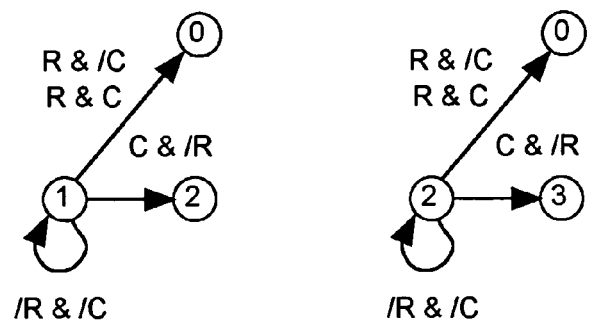
FIG. 4
FIG. 5

CIRCUIT PROPERTY VERIFICATION SYSTEM

BACKGROUND OF THE INVENTION

1. Field of the Invention

The present invention relates in general to tools for verifying integrated circuit designs and in particular to a tool employing a simulator for verifying properties of a circuit design.

2. Description of Related Art

An integrated circuit (IC) design engineer normally models an IC using a hardware description language (HDL) to describe the behavior of the various components making up a circuit and the manner in which those components interact. The design engineer typically uses a circuit simulator to simulate circuit behavior based on the HDL model to verify that the circuit will behave as expected before the IC is fabricated based on the HDL model.

A circuit simulator simulates the behavior of a circuit based on the HDL description of the circuit as it would respond over time to a sequence of input signals. The simulator can produce output waveform data representing the behavior of the circuit's output signals as well as the circuit's "internal" signals that would not appear at the circuit's output terminals. In addition to providing a simulator with the HDL description of the circuit to be simulated, the design engineer also provides the simulator with a "test bench", a data file describing the time-varying behavior of input signals that are to stimulate the circuit. The test bench also indicates the various circuit output and internal signals that are to be monitored during the simulation to determine whether the simulated circuit is behaving as expected. Thus a simulation verifies whether a circuit described by an HDL file will respond as expected to a particular sequence of input signal states specified by the test bench.

Design engineers often like to verify that a circuit has one or more particular properties. We say a circuit possesses a "property" if it always exhibits a particular consequent behavior following a particular antecedent event. An "antecedent event" can be any particular pattern in any combination of the circuit's input, output and internal signals. A "consequent event" can be any particular pattern in any combination of the circuit's output and internal signals. Note that a consequent behavior involves only the signals that the circuit generates (output and internal) and does not involve the input signals that the circuit receives. Thus once an antecedent event occurs, the circuit having a particular property will exhibit the consequent behavior regardless of the behavior of its input signals following the antecedent event. To fully verify that a circuit has a particular property, we must verify that the circuit will exhibit a particular consequent behavior in response to an antecedent event regardless of the behavior of any of its input signals following the antecedent event.

When the antecedent event is defined only in terms of the circuit's input signals, the circuit must exhibit the consequent behavior regardless of its current state when the antecedent event occurs. For example suppose a circuit has the property of responding to an input RESET signal (an antecedent event) by generating an ACKNOWLEDGE signal two clock cycles after receiving the RESET signal (a consequent behavior). Thus regardless of the state of the circuit when it receives the RESET signal, it will generate the ACKNOWLEDGE signal two clock cycles later.

To use a simulator to completely verify that a circuit has such a property, a design engineer would have to prepare a test bench capable of driving the circuit to every possible state and applying the RESET signal to determine whether the circuit would produce an ACKNOWLEDGE signal two cycles later. Since the circuit would have input signals other than the RESET signal, the test bench would also have to test every possible combination of input signal behavior after the RESET signal is asserted to determine whether any such combination would prevent the circuit from generating the ACKNOWLEDGE signal two cycles after the RESET signal. Preparing such a test bench is normally not feasible for even modestly complex circuits because complex circuits can exist in a very large number of possible ("reachable") states and can have a large number of input signals. A design engineer might also have much difficulty determining how to drive a circuit to every reachable state. In any case such a simulation would likely take too much processing time. Thus a circuit simulator is usually not a good tool for completely verifying that a complex circuit has a particular property.

A conventional "state space generation" tool generates a "state space" model of a circuit design such as a binary decision diagram (BDD) representing all of the states the circuit can reach from its initial state and indicating the input signal events that cause the circuit to transition between states. A conventional "state space model analysis" tool can analyze a state space model to locate each occurrence of a particular antecedent event and to determine whether in all cases the circuit will exhibit a particular consequent behavior in response to each antecedent event. Thus state space generation and analysis tools can completely verify a circuit property. Since such tools work automatically, they free the design engineer from having to develop a complicated test bench to verify a circuit property. However even a moderately complex circuit can have such an enormous number of reachable states that a state space generation and analysis tool usually requires an impractically large amount of processing time and resources to verify a circuit property.

Thus as a practical matter, a circuit simulator can normally only partially verify a property of a complex circuit. And while state space model generation and analysis tools can completely verify a circuit property, they can do so only for relatively simple circuits.

What is needed is a practical system for verifying a property of a complex circuit with a greater degree of certainty than is feasible using a simulator, but with greater speed than is possible using conventional state space model generation and analysis tools.

SUMMARY OF THE INVENTION

The present invention relates to a system for verifying that a clocked circuit described by an HDL file or other circuit specification has a particular property in that it exhibits a particular consequent behavior in response to a particular antecedent event. An "antecedent event" can be any pattern of state changes in one or more of the circuit's input, output or internal signals. A "consequent behavior" can be any pattern of state changes any one or more of the circuit's output or internal signals that occurs during a finite number N of system clock cycles following the antecedent event.

In accordance with the invention, the circuit property verification system includes a conventional circuit simulator for simulating the behavior of the circuit defined by the HDL file in response to input signals defined by a user-provided test bench. The simulator produces output waveform data representing the behavior of the circuit's input and output signals and any internal circuit signals controlling the current state of the simulated circuit.

The circuit property verification system also includes an "antecedent event detector" for monitoring the simulator output waveform data and for identifying each occurrence of an antecedent event of a circuit property to be verified. The system samples and stores the simulator output waveform data representing the current state of the simulated circuit whenever the antecedent detector detects an occurrence of the antecedent event.

The system also generates a temporally expanded model of the circuit whenever the antecedent detector detects an occurrence of the antecedent event. The temporally expanded circuit model represents the circuit as a set of N circuit functions $CKT_1$–$CKT_N$, each corresponding to a separate one of the N clock cycles following the antecedent event in which the consequent behavior occurs. The Kth circuit function $CKT_K$ has a first input variable $IN_{K-1}$ representing the states of the circuit's input signals at the start of clock cycle k. A second input variable $STATE_{K-1}$ of function $CKT_N$ represents the states of internal or output signals defining the state of the circuit at the end of clock cycle K-1. Each circuit function $CKT_K$ produces an output variable $CB_K$ representing the state of any each signal that may be included in the definition of the consequent behavior during clock cycle K, and an output variable $STATE_K$ representing the state of the circuit during clock cycle K. The sampled state of the simulated circuit forms the $STATE_0$ input variable to circuit function $CKT_1$. Thus $$(CB_K, STATE_K)=CKT_K(IN_{K-1}, STATE_{K-1})$$

The circuit function output variables $B_1$–$B_K$ are inspected for all combinations of input variables $IN_0$–$IN_{N-1}$ to determine whether the circuit in all cases will exhibit the consequent behavior in response to detected antecedent event following each occurrence of the antecedent event during the simulation.

The property verification system of present invention reduces the processing time and resources needed to verify a circuit property by limiting the investigation of the circuit behavior to only those states that may be reached following occurrence of an antecedent event under the conditions defined by the test bench within the time in which the antecedent event is specified to occur. When the test bench is designed to operate the simulated circuit under all conditions under which the real circuit is likely to encounter the antecedent event, then the property verification system of the present invention provides a sufficiently comprehensive, though not exhaustive, verification of the circuit property.

It is accordingly an object of the present invention to provide a system for verifying that a circuit described by a specification will exhibit a particular property whenever the antecedent event occurs under conditions specified by the test bench.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 is a top-level block diagram of a conventional counter circuit that may be simulated by a circuit simulator, FIG. 2 is an event diagram illustrating the behavior of a simulated version of the counter of FIG. 1 during an sequence of input signal state changes defined by an example test bench, FIG. 3 illustrates an exhaustive state space model of the counter of FIG. 1 that might be generated by a conventional state space model generation tool, FIGS. 4 and 5 illustrate time-limited state space models of the circuit of FIG. 1 rooted on sampled states of the counter of FIG. 1, FIG. 6 illustrates in block diagram form a circuit property verification system in accordance with the invention, FIG. 7 illustrates in block diagram form a temporally expanded circuit model as may be employed by the system of FIG. 6;

DESCRIPTION OF THE PREFERRED EMBODIMENT(S)

Circuit Simulation

Figure 6:
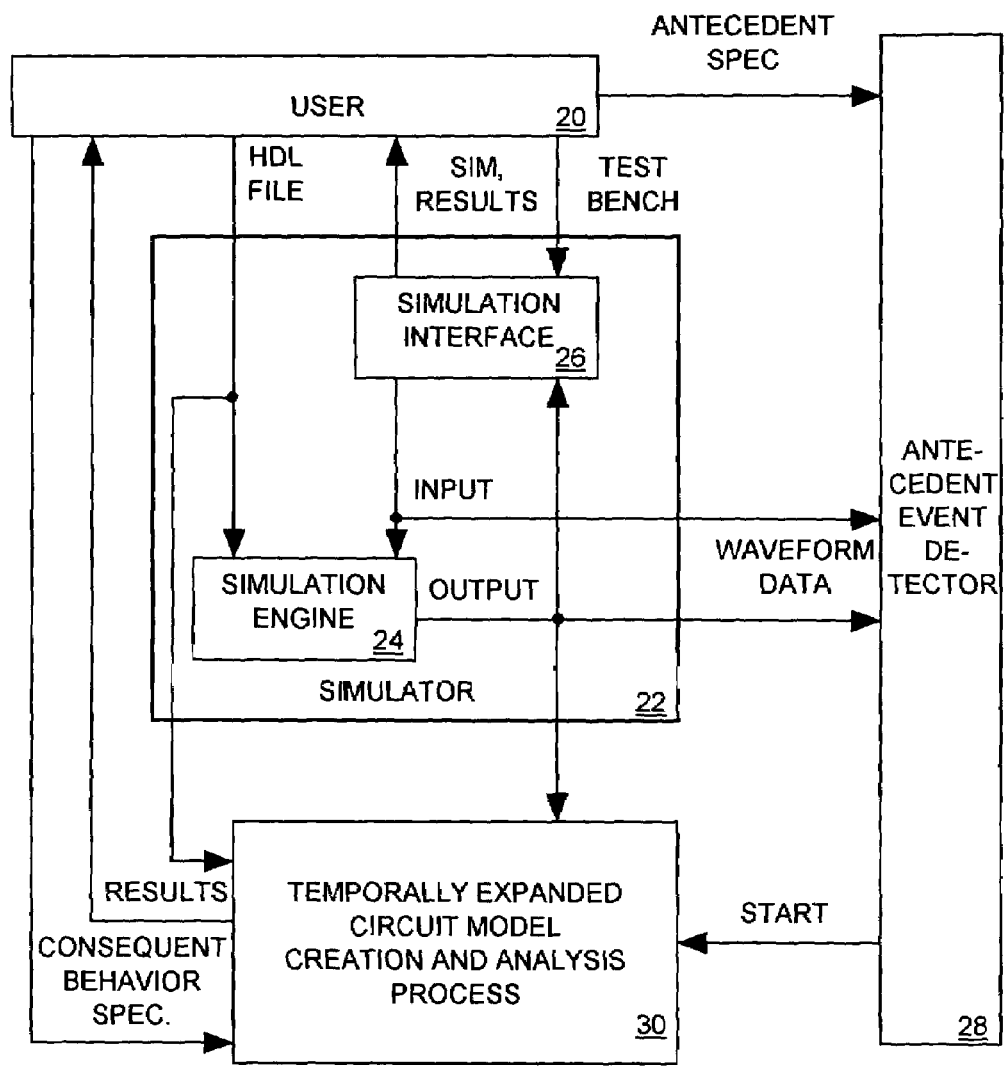

An integrated circuit (IC) design engineer typically models a circuit using a hardware description language (HDL) to describe the behavior of the various components forming the circuit and the manner in which those components interact. Before sending the circuit design to an IC fabricator, the design engineer usually employs a circuit simulator to simulate circuit behavior based on the HDL circuit description to verify that the circuit will behave as expected.

A conventional circuit simulator simulates the behavior of a circuit as it would respond over time to changes in state of its input signals. In addition to providing a simulator with the HDL circuit description, the design engineer also provides a "test bench" file describing the time-varying behavior of the input signals that stimulate the circuit. An "input" signal is any signal applied to the circuit that is not generated by the circuit itself. The test bench file also indicates various circuit output or internal signals that are to be monitored during the simulation to determine whether the simulated circuit is behaving as expected. An "output" signal is a signal generated by a circuit that appears at one of its output terminals whereas an "internal" signal is a signal generated within a circuit that does not appear at its output terminals.

FIG. 1 is a simple block diagram of a conventional counter circuit 10 that might be simulated. Counter 10 produces a 3-bit output N representing a number of times a COUNT input signal was true on an edge of a CLOCK signal. The value of N is 0 when the clock circuit is initialized and can go as high as 7 before it overflows to 0. Whenever a RESET input signal is driven true on the edge of the CLOCK signal, counter 10 drives its output count N to 0 regardless of the current state of the COUNT signal. If neither the RESET signal nor the COUNT signal is true on the edge of a CLOCK signal, the output count N remains unchanged. We can think of counter 10 as a state machine having eight states numbered 0 through 7 wherein its output number N matches its current state.

FIG. 2 illustrates the behavior of counter 10 during an example sequence of input signal state changes as might be defined by a test bench. At starting time 0, counter 10 is in state 0. The test bench drives the COUNT signal true (C) and drives the RESET signal false (/R) before the next CLOCK signal edge so that at time 1 counter 10 moves to state 1. The RESET signal is then set true (R) with the count signal is set false (/C) before the CLOCK signal edge at time 2 so that counter 10 returns to state 0 at time 2. The test bench then sets the COUNT signal true and RESET signal false (C & /R) for the next two clock cycles so that counter 10 advances to states 1 and 2 at times 3 and 4. The test bench then sets the RESET signal true and the COUNT signal false (R & IC) to reset counter to state 0 at time 5.

As may be seen from FIG. 2, the counter 10 moves from state-to-state over time in response to state changes in its input signals. In order to exhaustively verify that counter 10 will behave as expected in every possible state, a design engineer would have to determine whether circuit 10 will respond correctly on each clock signal edge to each of the four combinations of states of the binary RESET and COUNT signals. Note in FIG. 2 that in the transition from state 1 at time 1 to state 0 at time 2, only one combination of input signal states (R & IC) is tested. When state 1 is revisited at time 3, a different combination of input signal states (C & /R) is applied. Thus the portion of the simulation illustrated in FIG. 2 tests the response of the circuit in state 1 for only two of the four possible RESET and COUNT signal state combinations. The simulation will not tell us what counter 10 will do in response to the combination of signal states (/R & /C) or (C & R) unless the test bench later drives counter 10 back to state 1 at least two more times and tests the counter's response to the two remaining input signal state combinations.

For a circuit such as counter 10 having only a few states and a few input signals it would not be difficult for a design engineer to develop a test bench that exhaustively tests the behavior of the circuit in every one of its possible ("reachable") states, and it would not take a simulator long to simulate the circuit's behavior in response to such a test bench. However a more complicated circuit may have an enormous number of internal states and a large number of input signals, and it can be difficult for a test engineer to develop a test bench that fully tests the behavior of circuit's response to every combination of input signal states when in every possible state. In any case an impractically large amount of computing time or resources may be needed to carry out the simulation. Design engineers therefore restrict the scope of simulations of complicated circuits, for example to extend only to states in which the circuit is likely to be driven in its intended operating environment and to test those states only for combinations of input signal states the circuit is likely to encounter.

Property Verification

Design engineers often like to verify that an integrated circuit specified by an HDL file will have one or more particular properties. We say a circuit possesses a "property" if it always exhibits a particular consequent behavior following a particular antecedent event. An "antecedent event" can be any particular pattern in any combination of the circuit's input, output and internal signals, while a "consequent behavior" can be any particular pattern in any combination of the circuit's output and internal signals. An antecedent event or a consequent behavior can be sequences of actions occurring over a period of time. The invention relates in particular to circuits implementing logic that is synchronized to a clock signal input so that with respect to antecedent events and consequent behavior, "time" advances in discrete steps defined by edges of the clock signal. When the circuit includes memory devices that store data, a circuit's current state can be a function of a long sequence of input signal states.

The notion of property relates to a finite sequence of observations of the stimulus and response behavior of a circuit implementing a linear, integer-time, point-based temporal logic with bounded future-time operators that include operators such as memory arrays, sets, stacks, first-in/first-out (FIFO) buffers and the like. We can define a property p1 by the expression of the form p1: p=>q, where p is the antecedent event and q is the consequent behavior. Both p and q are associated with timing expressions. The antecedent p defines the activation clause for property p1, while the consequent behavior q specifies the response characteristic of the circuit. For example, the expression $$rst=>\sim rst@1=>req@[1\ldots]=>ack@2$$

describes a circuit property. The antecedent event is a negative-going reset signal (rst) edge followed by a request signal (req) set to a 1 any time thereafter. The consequent behavior of the circuit is production of an acknowledge signal (ack) two clock cycles later.

Counter circuit 10 of FIG. 1 has the property of responding to an input RESET signal that is true on one CLOCK signal edge (an antecedent event) by returning to state 0 by the next CLOCK signal edge where it drives the value N of its output signals to 0 (consequent behavior). Note that this particular property is independent of the counter's current state at the time the RESET signal is asserted because counter 10 will drive its output to 0 in response to the RESET signal regardless of its current output count at the time it receives the RESET signal. Note also that the property has a temporal aspect; the state transition must occur one clock cycle after the RESET signal.

Referring again to FIG. 2, in transitioning between state 1 and state 0 between times 1 and 2, the simulation only verifies that the input signal combination (R and /C) causes counter 10 to transition from state 1 to state 0. The simulation does not test whether the combination (R and C) will produce the desired state transition. Thus to verify the property the test bench would have to drive the circuit back to state 1 and try the combination of R and C to determine whether the counter will return to state 0. Since as discussed above it is often impractical to use a simulator to test the response of a complicated circuit to every combination of input signal states when the circuit is in every possible one of its states, it can also be impractical to use a simulator to exhaustively verify that a complicated circuit design has a particular property, particularly when the antecedent event can occur when the circuit is in any one of a very large number of possible states.

State Space Modeling and Analysis

A conventional state space model generation tool automatically converts an HDL description of a circuit design into a state space model of the circuit, such as for example a binary decision diagram (BDD). A state space model represents all of the states the circuit can reach from an initial state and indicates how each combination of input signal events causes the circuit to transition from any state to any other state. A conventional state space analysis tool can analyze a state space model to completely verify that the circuit behavior it models has a particular property by verifying that the appropriate consequent behavior follows every incidence of an antecedent behavior.

FIG. 3 illustrates a BDD state space model 12 of counter 10 of FIG. 1 that might be generated by a conventional state space model generation tool. The state space model is "exhaustive" because it includes every state to which counter circuit 10 could be driven and indicates the input signal combinations that instigate every possible state transition. For example, the model of FIG. 3 indicates that the circuit can transition from state 0 to state 1 on a CLOCK signal edge only if the COUNT signal is true and the RESET signal is false (C & \R). Circuit 10 responds to the other three RESET and COUNT signal state combinations by remaining in state 0.

FIG. 3 shows circuit 10 transitions from state 1 to state 0 if RESET is true and COUNT is either true or false (R & C) or (R & /C) circuit 10 transitions from state 1 to state 2 if RESET is false and COUNT is true (/R & C) and stays in state 1 if both RESET and COUNT signals are false (/R & /C). The model of FIG. 2 similarly defines all transitions from states 2–7.

The exhaustive state space model 12 contains all of the information needed to verify any property of counter 10 because it represents the behavior of the circuit in all of its states in response to all combinations of input signal states. For example, we can verify by inspection of FIG. 3 that circuit 10 has the property of responding to a true RESET signal (antecedent event) by going to state 0 (consequent behavior). In particular we can easily see that the property holds true for every reachable state 0–7 of the circuit because it shows a transition from every state to state 0 under all conditions in which the RESET signal is true. A conventional state space model analysis tool can similarly verify the property by inspecting every reachable state and determining whether regardless of the state of the COUNT signal a true RESET signal sends the counter back to state 0 in the CLOCK signal cycle.

The main advantage of conventional state space model generation and analysis tools over conventional circuit simulators with respect to property verification is that they completely verify a circuit property for every reachable state of the circuit without requiring the design engineer to develop a test bench. The main disadvantage to conventional state space generation and analysis tools is that they are usually impractical for all but relatively simple circuits; construction and analysis of a state space model of a complicated circuit requires an enormous amount of computing time and resources.

Simulators are more practical for verifying behavior of complicated circuits only because they allow the design engineer to limit the number of circuit states tested and the manner in which the circuit is stimulated when in each state. When developing a test bench the design engineer uses insight and experience to decide which circuit states the real circuit is likely to encounter and how its behavior should be tested in each state. Since a state space modeling tool lacks such insight and experience it tries to create a state space model encompassing every state to which the circuit could logically be driven, thereby defining a state space that is usually much larger than needed to verify that the circuit being modeled will exhibit a given property under the circumstances in which it is likely to operate.

Test Bench Limited Property Verification

The circuit property verification system of the present invention verifies a property of a complicated circuit with a higher degree of certainty than can be easily achieved through simulation alone but with much less computing time and resources than would be required by an exhaustive state space analysis. The system employs a conventional simulator to simulate a circuit, but whenever the antecedent event of a property occurs during the simulation, the system determines (samples) the current state of the circuit model. Thereafter, in a separate process that may run concurrently with the simulation, the system investigates whether the circuit, starting from the sampled state, will exhibit the consequent event under all subsequent combinations of input signal behavior. Since the consequent behavior must occur within some finite number N of clock cycles following that antecedent event, it is necessary for the system to investigate the various ways the circuit might behave only during the next N clock cycles in order to verify the consequent behavior.

For example, suppose a design engineer wants to verify the reset property of counter circuit 10 of FIG. 1. Here the antecedent event is the RESET signal being driven true, and the consequent behavior is counter circuit transitioning to state 0 one clock cycle later. Suppose also that the design engineer prepares a test bench specifying the simulation illustrated by FIG. 2. Whenever the antecedent event occurs during the simulation (RESET signal going true), the current state of counter 10 is sampled and recorded. In this case since the output data N also represents the state of the counter, it is necessary only to sample and record its value. Thus, for example, between time 1 and time 2 when the RESET signal is driven true, the system samples and records the state of the counter output signals to determine the current state (1) of the counter. The simulation then continues. When at time 2 the antecedent event again occurs, the system again samples the simulated circuits state.

Upon recording the sampled state of counter 10 on each occurrence of the antecedent event during the simulation, the property verification system determines whether the circuit, starting in the sampled state, will exhibit the consequent behavior under all input signal conditions that might within the time allotted for the consequent behavior. In this example the consequent behavior (returning to state 0) must occur in the next clock cycle following the antecedent event. Thus the scope of the property verification investigation is restricted to what the counter circuit might do in the next cycle in response to all combinations of input signal states when in the sampled states 1 and 2.

FIG. 4 is a "time limited" state space model of counter 10 representing the counter's sampled state 1 and all states (states 0 and 1) that the counter can reach in the single clock cycle following the antecedent event in which the consequent behavior (returning to state 0) is supposed to occur. FIG. 5 is a time limited state space model of counter 10 representing the counter's sampled state 2 and all states (states 0 and 3) that the counter can reach in the single clock cycle following the antecedent event in which the consequent behavior (returning to state 0) is supposed to occur. We can see by inspection of the models of FIGS. 4 and 5 that when circuit 10 is in either state 1 or state 2 it will respond to the antecedent event (asserting the RESET signal) by exhibiting the consequent behavior (returning to state 0). Clearly it is quicker to verify the circuit property with respect to models of FIGS. 4 and 5 than with respect to the model of FIG. 3 because the FIGS. 4 and 5 models cover a smaller portion of the circuit's state space. However a property verification carried out with respect to the state space model of FIG. 3 is more comprehensive because it verifies the property with respect to all states 0–7, not just two state 1 and 2.

The property verification system of the present invention therefore normally will not exhaustively verify the circuit property with respect to all possible (reachable) states of the circuit. It only verifies the property with respect to states reached during the simulation in which the antecedent event occurs. In the above example, if the design engineer's test bench only drives the RESET signal true when the simulated counter 10 is in states 1 and 2, then the system will not verify the property with respect to any other states. This limitation may seem more of a disadvantage than an advantage for the simple counter circuit 10 since a design engineer would likely want to verify the property for all eight of the counter's reachable states. However suppose, as is usually the case, the circuit design under consideration is much more complicated than counter 10 and has thousands or millions of reachable states, most of which the designer knows will never be reached in its intended operating environment. More particularly, suppose that the design engineer knows that in the circuit's intended operating environment, the antecedent event is only going to occur only when the circuit is in a limited number of its possible states. Then when the design engineer provides a test bench that drives the simulated circuit to those few states and completes the antecedent event as the circuit reaches those few states, the property verification system of the present invention will verify the circuit property with all the certainty that is needed. Thus the property verification system of the present invention allows the design engineer to automatically limit the scope of property verification by the way in the simulation test bench is written. By limiting the scope of the property verification the design engineer also reduces the amount of computing time and resources needed to verify the circuit property.

Property Verification System Architecture

FIG. 6 illustrates a circuit property verification system 18 in accordance with the present invention in block diagram form. A user 20 supplies an HDL file description of an integrated circuit and a test bench to a conventional circuit simulator 22. Simulator 22 includes a simulation engine 24 that simulates the behavior of the circuit defined by the HDL file in response to waveform data representing circuit input signals (INPUT). Simulation engine 24 produces output waveform data (OUTPUT) representing behavior of circuit output signals, including not only signals appearing at the circuit's output terminals but also all internal circuit signals that control the state of the circuit, including signals representing states of stored data. A simulation interface 26 generates the INPUT waveform data representing the circuit's input signals in the manner defined by the test bench, receives the OUTPUT waveform data and provides user 20 with a simulation results representing circuit behavior in a manner also defined by the test bench.

In accordance with the invention, property verification system 18 also includes an "antecedent event detector" 28, a software routine executed concurrently with simulator 22. User 20 supplies an "antecedent event specification" to detector 28 defining a particular pattern in the simulator output waveform data that represents an occurrence of antecedent event of a circuit property to be verified. Detector 28 is simply a pattern detector that monitors the simulator's INPUT and OUTPUT waveform data produced by simulator 22 to detect each occurrence of a pattern of signal defined by the antecedent event specification. Whenever it detects the antecedent event, detector 28 starts an instance of a "temporally expanded circuit model creation and analysis" process 30.

Process 30 samples the simulator's OUTPUT waveform data at the time the antecedent event occurs to determine the current state of the simulate circuit. Process 30 then creates a "temporally expanded" model of the circuit, and analyzes the model to determine whether the circuit defined by the HDL file will exhibit the consequent behavior defined by a user-provided consequent behavior specification within the number N of clock cycles allotted for the consequent behavior beginning in its sampled state regardless of the behavior of the circuit input signals during those N cycles.

Since a separate temporally expanded circuit model creation and analysis process 30 is instantiated on detection of each occurrence of the antecedent event during the circuit simulation, and since the processes are independent of one another, these processes can be carried out by parallel processing computers, thereby speeding verification.

Temporally Expanded Circuit Modeling and Analysis

Figure 7:
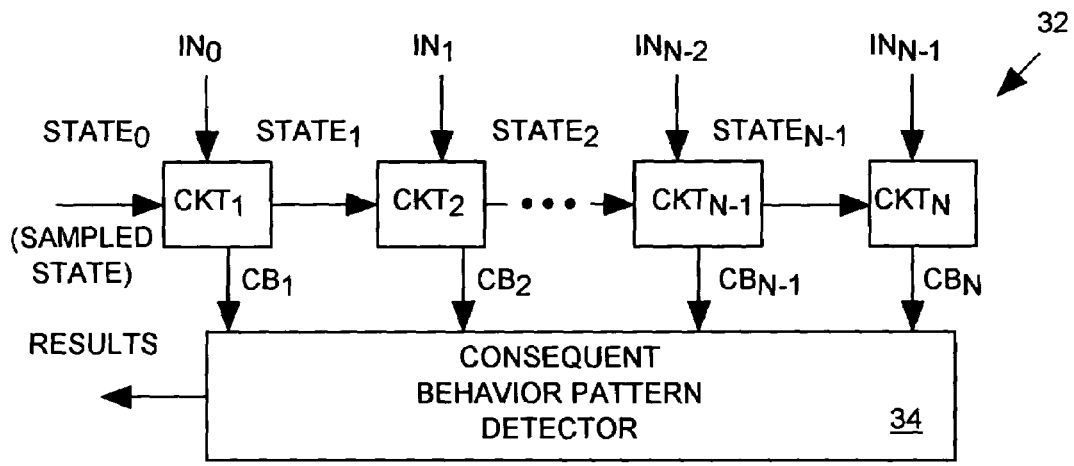

As illustrated in FIG. 7, based on the HDL description of the circuit being simulated, process 30 of FIG. 6 creates a "temporally expanded" circuit model 32, representing circuit behavior using a set of N functions $CKT_1$–$CKT_N$. Each circuit function $CKT_1$–$CKT_N$ corresponds to a separate one of the N clock cycles following the antecedent event in which the consequent behavior occurs. The Kth circuit function $CKT_K$ (where K=1 to N) has two input variables $IN_{K-1}$ and $STATE_{K-1}$. The $IN_{K-1}$ variable indicates the collective state of the simulated circuit's input signals at the end of clock cycle K-1. The $STATE_{K-1}$ input variable of function $CKT_K$ represents the state of simulated circuit at the end of cycle K-1. Each circuit function $CKT_K$ produces two dependent variable outputs. One output variable ($CB_K$) represents states the end of clock cycle K of any circuit signals included in the definition of the consequent behavior for clock cycle K. Another output variable ($STATE_K$) of circuit function $CKT_K$ represents the state of the circuit at the end of clock cycle K. As may be seen in FIG. 7, the sampled state of the simulated circuit ($STATE_0$) is an input variable to circuit function $CKT_1$. Thus we have $$(CB_K, STATE_K) = CKT_K(IN_{K-1}, STATE_{K-1})$$

Process 30 of FIG. 6 also implements a "consequent behavior pattern detector 341" which monitors the $CB_1$–$CB_N$ outputs of functions $CKT_1$–$CKT_N$ to verify the consequent behavior.

Figure 8:
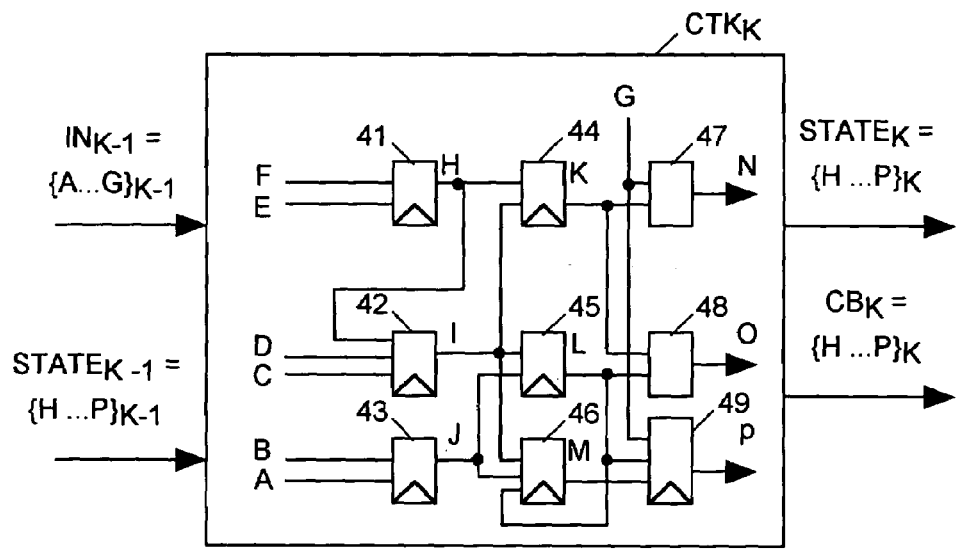
FIG. 8 illustrates an example circuit function in block diagram form that may be used as the circuit functions of FIG. 7.

Referring to FIG. 8, suppose a simulated circuit has nine components 41–49. Components 41–46 and 49 are clocked by the CLOCK signal (not shown); components 47 and 48 are not clocked. Gates 41–49 produce output signals H–P in response to a set of input signals A–G supplied by the test bench. The states of signals H–P define the state of the circuit. A consequent behavior for the circuit can be defined in terms of behavior of any one or more of signals H–P during one or more of the N cycles following an antecedent event. Thus a "generic" circuit function that could implement the Kth function $CTK_K$ of FIG. 7 might simply be a copy of the simulated circuit as illustrated in FIG. 8 that has its input and state signals reset to some desired value after each clock cycle. That generic function $CKT_K$ would receive as its input variables $IN_{K-1}$ and $STATE_{K-1}$ representing states of the set of input signals $\{A \ldots G\}_{K-1}$ and states of the set of state signals $\{H \ldots P\}_{K-1}$ for clock cycle K-1. Function $CTK_K$ would generate as its dependent output variables $STATE_K$ and $CB_K$, representing the set of states $\{H \ldots P\}_K$ of signals P H through P as they would appear at the end of clock cycle K for any particular value of input signals A–G.

However implementing each function $CKT_1$–$CKT_N$ using the generic function illustrated in FIG. 8 would require more processing time and resources than needed in order to verify the property. Since the definition of the consequent behavior normally will not include behavior of every circuit signal H–P during every one of the N clock signal cycles, the variables $CB_1$–$CB_N$ provided to detector 34 of FIG. 7 do not need to represents the state of every one of those signals H–P. Functions $CKT_1$–$CKT_N$ of FIG. 7 can therefore be substantially reduced versions of the generic functions of FIG. 8.

Suppose, for example, we want to verify that the circuit has the property of asserting its output signal P on the 3rd clock cycle (N=3) following the antecedent event. Since we are not interested in what the circuit does after the third clock cycle the verification system need only implement functions $CKT_1$–$CKT_3$ of FIG. 7. The following assumptions help us to reduce the complexity of the circuit functions:

1. Since in this case the values of $CB_1$ and $CB_2$ are irrelevant to the definition of the consequent behavior, functions $CKT_1$ and $CKT_2$ need not generate them.
2. Since only the state of signal P at the end of clock cycle N=3 is relevant to the definition of the consequent behavior, the $CB_3$ output of circuit $CKT_3$ need only represent the value of P. Hence circuit $CKT_3$ need not generate the set of state signals $\{H \ldots O\}_3$.
3. The state variable output $STATE_K$ of each circuit function $CKT_K$ need only represent the states of those of signals H–P that function $CKT_{K+1}$ needs in order to produce its necessary output data.
4. If state of one of the set of signals $\{H \ldots P\}K$ is a constant regardless of the state of input signals $IN_0$–$IN_{N-1}$, then the signal can be treated as a constant portion and function $CKT_K$ need not compute it as a function of its input variables.

Figure 9:
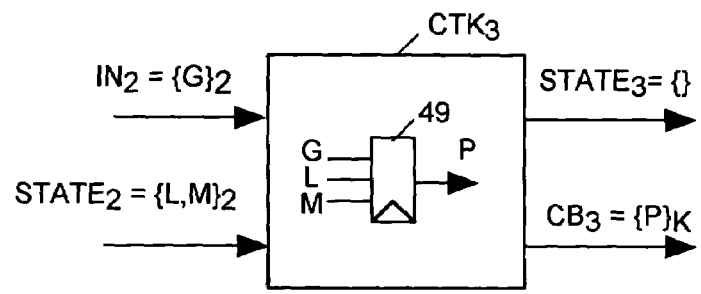
FIGS. 9–11 illustrate in block diagram form reduced forms of the circuit function of FIG. 8.

FIG. 9 illustrates the minimal circuit that circuit function $CKT_3$ must model. Since function $CKT_3$ need only produce output signal P, the function does not have to model any circuit components that do not influence the state signal P at the end of clock cycle N=3. The value of its output signal P at the end of clock cycle 3 depends solely on the value of state variables L and M and input signal G at the end of clock cycle 2. Logic blocks 41–48 of the generic circuit of FIG. 8 are not needed to supply data to block 49 because these circuit components have no influence on output signal P. The values of L and M that influence the value of P at the end of clock cycle N=3 are produced by function $CKT_2$, not by function $CKT_3$. Note also, that since function $CKT_3$ does not have to provide a state $STATE_3$ as input to a next function, and since signals H–M are not included in the definition of the consequent behavior, components 41–46 are not needed to produce signals H–M. Hence function $CKT_3$ need not model components 41–48. Thus we see that to verify the property, the function $CKT_3$ can be greatly simplified. It only needs to determine the behavior of signal P in response to all combinations of a single-bit input variable $IN_2$ and a two-bit input variable $STATE_2$, a total of 8 different input variable state combinations.

Figure 10:
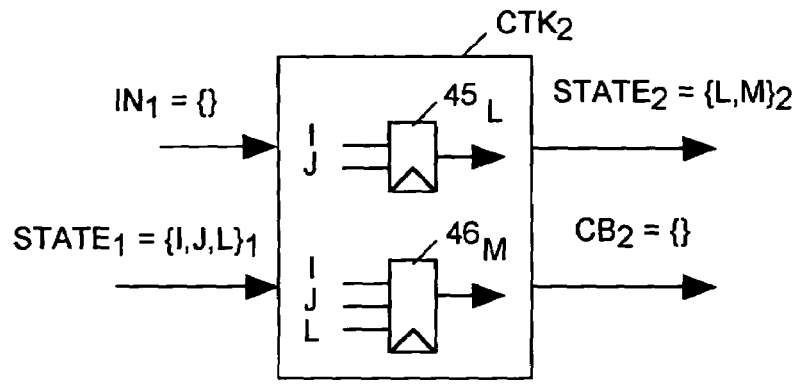

FIG. 10 illustrates circuit function CKT(2) of FIG. 7. Note that function $CKT_3$ (FIG. 9) need receive as it input a state variable $STATE_2$ representing the states only of the set of signals $\{L,M\}_2$. Note also that circuit function $CKT_2$ need not provide a $CB_2$ input to consequent behavior pattern detector 34 of FIG. 7. Hence circuit function $CKT_2$ need only model the behavior of components 45 and 46 needed to produce the out signals set $\{L,M\}_2$.

Figure 11:
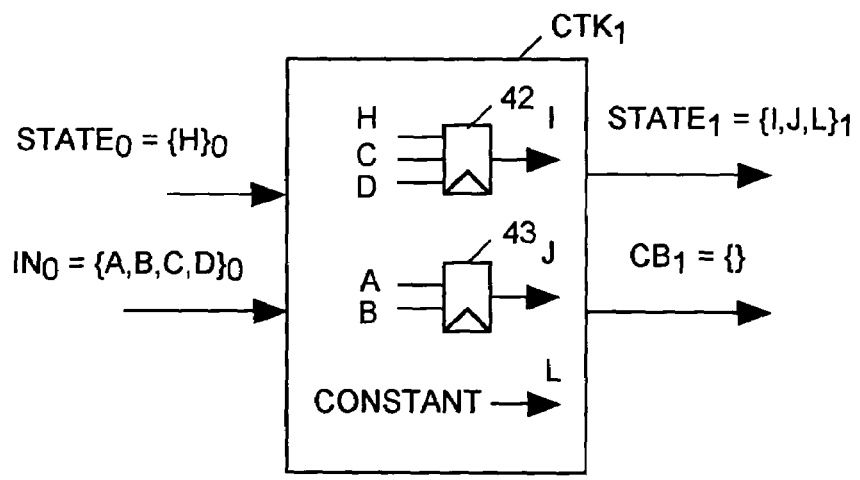

FIG. 11 illustrates function $CKT_1$ of FIG. 7. Function $CKT_1$ need not implement components 41, 44 or 47–49 because their output signals H, K and N–P have no influence on the input variable STATE 1 for function $CKT_2$ (FIG. 10) or on the $CB_1$ input to consequent behavior pattern detector 34 (FIG. 7). Although the output state variable STATE 1 of function $CKT_1$ must represent the output of component 45, the value of that signal will always be a constant function of the sampled values of signals J and L. Thus is not necessary for function $CKT_1$ to model competent 45.

Figure 12:
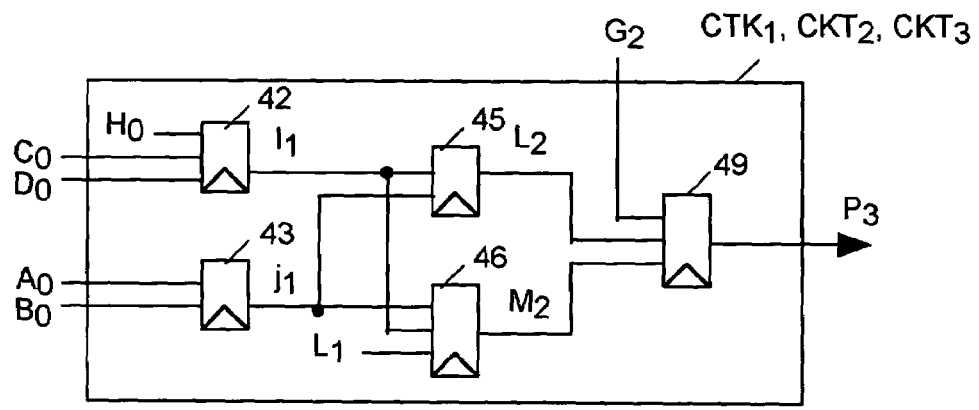
FIG. 12 illustrates in block diagram form the combined circuit functions of FIGS. 9–11.

FIG. 12 represents the resulting temporarily expanded circuit model that is implemented by a single function combining all of functions $CKT_1$–$CKT_3$ of FIGS. 9–11. Note that since the value $L_1$ of state signal L at the end of clock cycle N=1 and the value $H_0$ of state signal H at the end of clock cycle N=0 are constant functions of the sampled state of the simulated circuit. Note that the temporally expanded circuit model of FIG. 12 has only 5 input signals, the $A_0$-$D_0$ signals for clock cycle N=1 and the $G_2$ signal for clock cycle N=3. None of the other input signals for clock cycles N=1 to 3 have any influence on the state of output signal $P_3$ at the end of clock cycle N=3. The computing resources and time needed to implement and investigate the behavior of output signal $P_3$ at the clock cycle N=3 in response to various combinations of input signals during cycle N=1 to 3 are greatly reduced because the total number of bits of circuit function input variables $IN_0$ and $IN_2$ has been reduced from 21 to just 5. The system therefore need only investigate function response to only $2^5$ (32) input variable combinations in stead of $2^{21}$ (2,097,152) possible input variable combinations.

Time-limited State Space Modeling and Analysis

Figure 13:
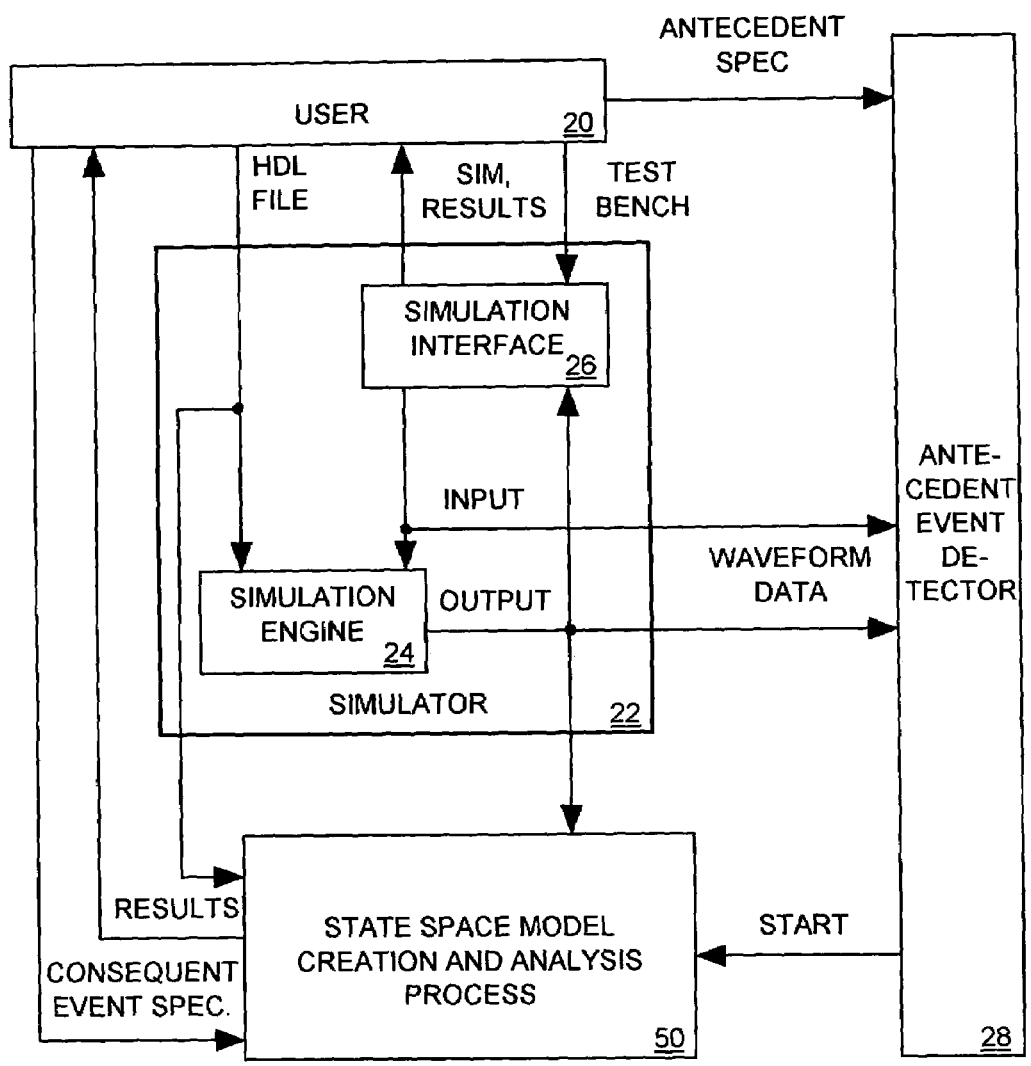
FIG. 13 illustrates in block diagram form an alternative embodiment of the circuit property verification system in accordance with the invention.

FIG. 13 illustrates an alternative embodiment of the invention that is generally similar to that of FIG. 6 except that the temporally expanded circuit model creation and analysis process 30 of FIG. 6 is replaced with a time-limited state space modeling and analysis process 50. Antecedent detector 28 starts an instance of process 50 whenever it detects an occurrence of the antecedent behavior during a circuit simulation. Process 50 then creates and analyzes a "time-limited" state space model of the circuit to determine whether the circuit will exhibit the consequent behavior during the N clock in which the consequent behavior it specified to occur.

Conventional art state space modeling systems convert an HDL file defining a circuit design into an exhaustive state space model of the circuit showing all states the circuit can reach from a starting state. Conventional state model analysis algorithms can investigate such a state space model to verify that the circuit exhibits any given property. In the example of counter 10 (FIG. 1), a conventional state space modeling system will generate the binary decision tree state space model illustrated in FIG. 3 which may be analyzed to determined whether the counter circuit will in all cases revert to state 0 in one cycle following the reset signal.

In accordance with the invention, a conventional state space modeling system is adapted to generate a state space model including only the circuit states that may be reached in the N clock cycles in which the defined consequent behavior is to occur. For example, process 50 would generate a limited state space model as illustrated in FIG. 4 or FIG. 5 instead of the exhaustive state space model illustrated in FIG. 3. Since the state space model is reduced, this allows a convention state space analysis algorithm included in process 50 to more quickly investigate the model to determine whether the circuit exhibits the property.

Thus has been shown and described a system for verifying that a circuit specification describes a circuit that specification will exhibit a particular property. While the forgoing specification has described a preferred embodiment of the present invention, one skilled in the art may make many modifications to the preferred embodiment without departing from the invention in its broader aspects. The appended claims therefore are intended to cover all such modifications as fall within the true scope and spirit of the invention.

We claim:

1. An apparatus for verifying that a circuit specification describes a circuit exhibiting a property defined as a consequent behavior occurring during clock cycles 1 through N of a clock signal following an antecedent event, wherein N is an integer greater than 0, wherein the circuit responds to input signals by producing output signals, wherein the antecedent event is a first state change pattern in at least one of the input and output signals, and wherein the consequent behavior is production of a second state change pattern in at least one of the output signals, the apparatus comprising:
   a circuit simulator for implementing a simulated circuit, wherein the simulated circuit simulates the circuit described by the circuit specification, wherein the circuit simulator produces output waveform data representing time-varying behavior of the input and output signals and representing a current state of the simulated circuit;
   detector means for detecting in the output waveform data an occurrence of a data pattern representing the antecedent event; and
   means for generating a temporally expanded model of the simulated circuit based on the circuit specification and on a state of the circuit upon the occurrence of data pattern as indicated by the output waveform data, the temporally expanded model representing the circuit as a set of N circuit functions $CKT_1$–$CKT_N$, each corresponding to a separate one of the N clock cycles and each representing behavior of the circuit during its corresponding clock cycle.

2. The apparatus in accordance with claim 1 wherein the Kth circuit function $CKT_K$ (for K=1 to N) has a first input variable representing states of circuit input signals at a start of clock cycle K that influence the consequent behavior.

3. The apparatus in accordance with claim 2 wherein the Kth circuit function $CKT_K$ (for K=1 to N) has a second input variable representing states of circuit output signals at the start of clock cycle K that influence the consequent behavior.

4. The apparatus in accordance with claim 3 wherein the Kth circuit function $CKT_K$ (for K=1 to N-1) has a first output variable representing states of circuit output signals at an end of clock cycle K that influence the consequent behavior.

5. The apparatus in accordance with claim 4 wherein the Kth circuit function $CKT_K$ (for K=1 to N-1) has a second output variable representing states of any circuit output signals at the end of clock cycle K that are included in the second state change pattern.

6. The apparatus in accordance with claim 5 further comprising means for receiving and analyzing the second output variable of each of the circuit functions to verify whether the circuit exhibits the consequent behavior.

7. A method for verifying that a circuit specification describes a circuit exhibiting a property defined as a consequent behavior occurring during clock cycles 1 through N of a clock signal following an antecedent event, wherein N is an integer greater than 0, wherein the circuit responds to input signals by producing output signals, wherein the antecedent event is a first state change pattern in at least one of the input and output signals, and wherein the consequent behavior is production of a second state change pattern in at least one of the output signals, the method comprising the steps of:
   a. simulating behavior of the circuit described by the circuit specification to produce output waveform data representing time-varying behavior of the input and output signals and representing a current state of the simulated circuit;
   b. generating a temporally expanded model of the simulated circuit based on the circuit specification and on a state of the circuit upon the occurrence of data pattern as indicated by the output waveform data, the temporally expanded model representing the circuit as a set of N circuit functions $CKT_1$–$CKT_N$, each corresponding to a separate one of the N clock cycles and each representing behavior of the circuit during its corresponding clock cycle.

8. The method in accordance with claim 7 wherein the Kth circuit function $CKT_K$ (for K=1 to N-1) has a first output variable representing states of circuit output signals at an end of clock cycle K that influence the consequent behavior.

9. The method in accordance with claim 8 wherein the Kth circuit function $CKT_K$ (for K=1 to N-1) has a second output variable representing states of any circuit output signals at the end of clock cycle K that are included in the second state change pattern.

10. The method in accordance with claim 9 further comprising the step of:
   c. receiving and analyzing the second output variable of each of the circuit functions to verify whether the circuit exhibits the consequent behavior.

11. The method in accordance with claim 10 wherein the Kth circuit function $CKT_K$ (for K=1 to N) has a first input variable representing states of circuit input signals at a start of clock cycle K that influence the consequent behavior.

12. The method in accordance with claim 11 wherein the Kth circuit function $CKT_K$ (for K=1 to N) has a second input variable representing states of circuit output signals at the start of clock cycle K that influence the consequent behavior.

13. An apparatus for verifying that a circuit specification describes a circuit exhibiting a property defined as a consequent behavior following an antecedent event, wherein the circuit responds to input signals by producing output signals, wherein the antecedent event is a first state change pattern in at least one of the input and output signals, and wherein the consequent behavior is a second state change pattern in at least one of the output signals, the apparatus comprising:
   a circuit simulator for implementing a simulated circuit, wherein the simulated circuit simulates the circuit described by the circuit specification, wherein the circuit simulator produces output waveform data representing time varying behavior of the input and output signals and representing a current state of the simulated circuit;
   detector means for detecting in the output waveform data an occurrence of a data pattern representing the antecedent event;
   means for generating a state space model of the simulated circuit representing states of the simulated circuit that are reachable from the current state of the simulated circuit represented by the circuit simulator output waveform data within a finite number of clock signal cycles after the detector means detects the data pattern representing the antecedent event; and
   means for analyzing the state space model to verify the circuit exhibits the consequent behavior.

14. The apparatus in accordance with claim 13 wherein the circuit transitions between states only on edges of a periodic clock signal supplied as input thereto, and wherein the consequent behavior occurs during the finite number of periods of the clock signal following the antecedent event.

15. The apparatus in accordance with claim 14 wherein the state space model represents only states of the simulated circuit that are reachable from the current state of the simulated circuit represented by the circuit simulator output data within the finite number of clock signal cycles after the detector means detects the data pattern representing the antecedent event.

16. A method for verifying that a circuit specification describes a circuit exhibiting a property defined as a consequent behavior following an antecedent event, wherein the circuit responds to input signals by producing output signals, wherein the antecedent event is a first state change pattern in at least one of the input and output signals, and wherein the consequent behavior is a second state change pattern in at least one of the output signals, the method comprising the steps of:

simulating the circuit to produce waveform data representing successive state changes of the input and output signals and representing successive states of the circuit;

generating a state space model of the simulated circuit representing states of the simulated circuit that are reachable from the current state of the simulated circuit represented by the circuit simulator output waveform data within a finite number of clock signal cycles after the detector means detects the data pattern representing the antecedent event; and analyzing the state space model to verify the circuit exhibits the consequent behavior.

17. The method in accordance with claim 16 wherein the circuit transitions between states only on edges of a periodic clock signal supplied as input thereto, wherein the consequent behavior occurs during the finite number of periods of the clock signal following the antecedent event.

18. The method in accordance with claim 16 wherein the generated state space model includes only states of the circuit that are reachable from the current state of the circuit represented by the waveform data within the finite number of clock signal cycles after the waveform data represents the antecedent event.

* * * * *